United States Patent Office 3,244,519
Patented Apr. 5, 1966

3,244,519

PHOTOPOLYMERIZATION IN STRATUM TRANSFER EFFECTED WITH COLORLESS WATER INSOLUBLE COLLOIDAL ORGANIC COMPOUND

Andre K. Schwerin, Binghamton, N.Y., assignor to General Aniline & Film Corporation, New York, N.Y., a corporation of Delaware No Drawing. Filed Nov. 2, 1961, Ser. No. 149,519
8 Claims. (Cl. 96—28)

This invention relates generally to photography and more particularly to novel photopolymerizable compositions and processes for the production of positive transfer images by the exposure of said novel photopolymerizable compositions to actinic light.

The preparation of images from photopolymerizable coatings is well known in the art. Generally speaking, an aqueous solution of a vinyl monomer or mixtures of vinyl monomers, together with a light-sensitive polymerization initiator, are coated upon a suitable support and exposed to actinic light through an image-bearing transparency. The actinic light initiates polymerization of the vinyl monomer in those areas of the coating where the actinic light has impinged causing those areas to become water insoluble, whereas the unexposed portions remain unaltered. The coating can then be washed so as to remove the unpolymerized portions and thus yield a negative image or the coating can be pressed against a suitable transfer sheet so as to obtain a positive image on the transfer sheet.

The use of photopolymerizable compositions for the production of positive images by the transfer technique are known in the art. Typically, an exposure material (photopolymerizable) may be made by coating on a base a composition comprising an ethylenically unsaturated monomer such as acrylamide, a light-sensitive ferric salt capable of yielding ferrous ions on exposure, such as ferric ammonium citrate and a water soluble photographic colloidal binder such as gelatin, polyvinyl alcohol, or the like. After exposure to light through a pattern, the coating is treated with a weak solution of a per compound such as hydrogen peroxide to induce photopolymerization. The unexposed portions of the coatings are then washed out leaving a photopolymerized resist. This procedure, involving the use of ferric salts and per compounds, is described in detail in Evans et al. Serial No. 808,882, filed April 27, 1959, now U.S. Patent 3,101,270.

The exposed coating may then be pressed against a transfer sheet by which a faint positive image is obtained on the sheet. The transferred image comprises the unpolymerized, unexposed monomer and the photographic binder. The intensity of the transferred image may be increased by applying heat during the transfer operation, say a temperature of about 40 to 50° C.

These transfer processes suffer from many disadvantages which limit their utilization in commercial operations. In the first place, the quality of the transferred positive image was far from being satisfactory. If the image was transferred without the use of heat, the resulting positive image was very faint and lacked intensity. On the other hand, when heat was employed in the transfer step to increase the intensity of the positive image, the transferred image lacked definition and clarity due to the fact that no sharp borderline of the image could be maintained between the molten unexposed and the heat-resistant exposed parts of the coatings.

Therefore, it is the primary object of this invention to provide a novel process for the production of positive transfer images characterized by having extremely sharp borderline definition and a high degree of intensity.

Another object of this invention is to provide a novel process for the production of positive transfer images, which is efficient, economical and possesses simplicity of operation.

A further object of this invention is to provide a novel positive photopolymer transfer process wherein a multiplicity of positive images can be obtained from a single exposed photopolymerizable coating.

It is still another object of this invention to provide a novel process for obtaining a positive transfer image which can be readily utilized as a master in offset printing processes.

Further objects of the invention will become apparent from the following detailed description thereof.

It has now been found that a transfer process meeting the above objects can be obtained by using a photopolymerizable coating containing in addition to an ethylenically unsaturated monomer, a ferric salt and photographic binder, a water insoluble low molecular weight crystalloidal material having a boiling point of about 175° C., with or without a coloring material, exposing the coating underneath a pattern, treating the exposed material with a per compound of the type disclosed in the aforesaid Evans application and pressing the exposed material against a transfer sheet with moderate pressure.

The image obtained in this fashion is much more dense and is much sharper than those images obtained from an exposure material which does not contain the crystalloidal substance. The particular reason why the crystalloidal material improves the transfer process to the extent I have determined is not readily ascertainable but it appears that the crystalloidal material produces a softening effect which confers a rather sponge-like structure to the otherwise dry coating. Therefore, it is possible to effect the transfer by moderate pressure, without the necessity of employing any heat treatment.

I may employ in the sensitized coating any photopolymerizable monomer containing the grouping $CH_2{=}{<}$. Examples of such compounds are referred to in the aforesaid Evans et al. application. Typical monomers are N,N' - methylene - bisacrylamide, acrylamide, methacrylamide, methylolacrylamide, N-ethanolacrylamide, acrylonitrile, methacrylic acid, acrylic acid, calcium acrylate, vinylpyrrolidone, vinylmethyl ether and the like.

Typical ferric salts used in the photopolymerizable coating are also described in the aforesaid Evans et al. application and include both inorganic and organic salts such as ferric chloride, ferric ammonium citrate, ferric ammonium oxalate and the like.

The per compounds to which I may resort in processing the exposed material are those mentioned in the aforesaid Evans et al. application and contain the grouping, —O—O—. Examples of such compounds are hydrogen peroxide, cumene hydroperoxide, di-tertiary butyl peroxide, ammonium persulfate and the like.

The water soluble photographic colloids or binders which may be employed are those usual in the art such as gelatin, polyvinyl alcohol, carboxymethylcellulose, casein or the like. Manifestly, the particular colloidal binder or carrier is not a critical feature of the invention.

The essential feature of the present invention is the use in the exposure material for the transfer process of the crystalloidal material having a boiling point of about 175° C. Such compounds are disclosed in detail in Jelley et al., U.S. Patent 2,322,027 granted June 15, 1943. This patent described the crystalloidal materials as follows: "the high-boiling crystalloidal materials which we contemplate using have been referred to as 'oil formers' because they have the property of producing an oil or liquid solution. . . . The compounds are generally liquid at ordinary temperatures or low melting solids (below 100° C.). It has been found also that in general the most useful compounds contain one or more polar groups such as halogen, hydroxyl, carboxylic acid, amide, ketone, etc., although this is not a limiting factor. . . . They should also be substantially colorless and stable toward light, heat and moisture, in addition to being inert to the various processing baths which may be encountered. . . . . They should be of low volatility and in general we have found that compounds suitable for this purpose have boiling points above 150 or 175° C. at atmospheric pressure. They should be permeable to photographic processing solutions. . . .

Examples of the classes of compounds which may be used are:

ACIDS p-Sec.-amylbenzoic acid
β-Phenylpropionic acid
Dibenzyl acetic acid
Phenyl ethyl acetic acid
Mono-n-amylphthalate (acid ester)
Undecylenic acid
Benzyl hydrogen succinate (acid ester)

ALCOHOLS n-Hexylphenylcarbinol
β-(p-Tert. butyl phenoxy)-ethyl alcohol
Benzoyl piperidine

AMIDES

Acetyl N-butyl aniline
Acetzl methyl p-toluidine
Benzoyl piperidine

AMIDE DERIVATIVES

N-n-amylphthalimide
N-n-amyl succinimide
N-2-cyanobutylphthalimide

CARBAMATES

Ethyl N,N-di-n-butyl carbamate
Ethyl N-phenyl carbamate

ESTERS

Tetrahydrofurfuryl benzoate
Tetrahydrofurfuryl succinate
Ethyl benzyl malonate
Methyl phthalate
Ethyl phthalate
Propyl phthalate
n-Butyl phthalate
n-Amyl phthalate
Iso-amyl phthalate
Benzyl phthalate
β-Methoxyethyl phthalate
β-Ethoxyethyl phthalate
β-Butoxyethylphthalate
Ethyl-a-naphthoate
Methyl o-methoxybenzoate
Butyl o-methoxybenzoate
α-Naphthyl acetate
Methyl p-toluenesulfonate
Ethyl o-anisate
Methyl phthalyethyl glycolate
Butyl phthalylbutyl glycolate
Resorcinol diacetate
n-Hexyl benzoate

KETONE DERIVATIVES

Benzophenone
α,4'-dichlorobenzophenone
α-Methoxy acetophenone
Acetophenone
2,4-dihydroxy valerophenone
p-Sec.-amylbenzophenone

PHENOL ETHERS

Veratrole (1,2-dimethoxybenzene)
Eugenol methyl ether
Hydroquinone dimethyl ether

PHOSPHATE ESTERS

Triphenyl phosphate
Tricresyl phosphate
Diphenyl mono-p-tert. butyl phenyl phosphate
Monophenyl di-p-tert. butyl phenyl phosphate
Diphenyl mono-ochlorophenyl phosphate
Monophenyl di-o-chlorophenyl phosphate
Tri-p-tert. butyl phenyl phosphate
Tri-o-phenylphenyl phosphate
Di-p-tert. butyl phenyl mono (5-tert. butyl-2-phenylphenyl) phosphate

SULFONAMIDES p-Toluenesulfonyl methyl o-toluidine
p-Toluenesulfonyl diamethylamide

SULFONAMIDE DERIVATIVES p,p'-Di-n-amylbenzenesulfonanilide
p-Toluenesulfcnyl di-n-butyl amide

SULFONES n-Butyl sulfone
Iso-amyl sulfone

UREAS

N,N'-diethyl-N,N-diphenyl urea
N,N-di-n-butyl urea

The amount of the crystalloidal material which can be advantageously incorporated into the photopolymerizable compositions of the invention is not narrowly critical and can vary over a wide range. However, it has been found that from 5–55 percent and preferably from 10–40 percent by weight of these compounds based on the amount of dry binder employed provide satisfactory results.

In another aspect of this invention, it is preferred to incorporate an oil soluble dye into the photopolymerizable coating so that the transferred image will be colored. It is to be immediately understood that the dyes which are employed are conventional and the invention is not limited to a specific class of dyes. The only limitation on the dye employed is that its be soluble in the crystalloidal material, and that it does not have any deleterious effect on the polymerization. As examples of dyes which have proven operable in the process of this invention, one can include Nigrosine, Sudan Red OB, Sudan Brown, Heliogen Blue, Oil Brown G, Oil Yellow, etc.

It is also to be understood that the treatment with the weak solution of peroxide can be accomplished in a variety of ways with satisfactory results. Thus, the exposed photopolymerization coating can be dipped in a dilute solution of a compound such as a 1 to 3 percent hydrogen peroxide solution or the surface of the exposed photopolymerizable coating can be coated with a weak peroxide solution by vaporization or application with a wet sponge. Additionally, it is also possible to wet the backside of the exposed sheet during contact with the transfer sheet with a dilute solution of hydrogen peroxide. This latter technique is especially advantageous when it is desired to avoid any mechanical moistening agent in order to minimize surface abrasions of the swollen light-sensitive layer. It is also to be understood that, instead of treating the coating after exposure with a weak solution of a per compound, it is also possible to incorporate the per compound directly into the photopolymerizable coating and then dampen the exposed coating with water before the transfer operations. Per compounds which are especially adapted to be incorporated into the photopolymerizable coatings include paramethane hydroperoxide, diispropyl benzene hydroperoxide, and cumene hydroperoxide. The preferred compound is cumene hydroperoxide.

It has also been discovered that the transfer image consisting of the unexposed gelatin, the crystalloidal material, the oil soluble dye, monomer and traces of the light-reduced ferric salts sometimes contains yellow-brown spots due to excessive transfer of the iron salts. It has been ascertained that such spottiness can be prevented by the addition of a small amount of an alkali metal fluoride such as potassium fluoride or sodium fluoride. While not wishing to be bound by any theory of operation, it would appear that the fluoride acts as a complexing agent for the iron salts, thus prevening excessive transfer to the transfer sheet. It is also possible to dip the transferred coating into a dilute solution, e.g. 10 percent, of the fluoride and accomplish the same beneficial effect.

An increase in the stability of the photopolymerizable coating as well as its readiness to swell when in contact with moisture may be effected by incorporating therein from 1 to 25 percent by weight of a water-soluble polyethylene glycol of the general formula:

$$HOCH_2(CH_2OCH_2)_xCH_2OH$$

wherein $x$ is a positive integer of from 1 to 500. The preferred water-soluble polyethylene glycol is a polyethylene glycol having a molecular weight of around 500 to 2000.

In still another embodiment of this invention, it is possible to use an oil-soluble dye having an extremely high ultra-violet light absorption so that the resulting transferred image can be used as a master in the diazotype reproduction processes.

In still another embodiment of this invention, it is possible to treat the resulting transferred image with a solution of a soap such as sodium stearate in order to improve the ink receptivity of the transferred relief. It appears that the ferric salts which are always present to some extent in the transferred image react with the sodium stearate to produce ferric stearate which is highly receptive for greasy ink. It is immediately obvious that this technique is of extreme economic importance since the treated transfer image is readily available to be used directly as a printing master in conventional offset printing techniques. A great number of sharp prints of good density can be obtained on an offset machine from paper master treated according to the above-described procedure. It is to be understood, however, that positive copies may be obtained on any suitable surface such as film, plastics, tissue, paper, metal, etc. The following examples will illustrate the novel process of this invention, but it is to be understood that it is not intended that it be limited thereto.

*Example I*

| | | |
|---|---|---|
| Gelatin (15 percent) | cubic centimeters | 25 |
| Saponine (8 percent) | do | 3 |
| N,N'-methylene-bisacrylamide | gram | 0.5 |
| Ferric ammonium citrate (1 molar) | cubic centimeters | 4 |
| Nigrosine | grams | 0.5 |
| Phenyl ethyl alcohol | do | 4 |

was coated on a paper base and exposed to a 375-watt photo floodlight at a distance of 20" for a period of time of from 18 to 20 seconds through an image-bearing transparency. After the exposure, the entire assembly was dipped into a 1 percent solution of hydrogen peroxide.

The polymerized composition was then placed face down onto a paper transfer sheet and moderate pressure was applied. Upon removing the photopolymerized composition, a transferred image was obtained of a high degree of quality characterized by extremely sharp borderlines and having a high color density.

*Example II*

(FORMULATION CONTAINING PEROXIDE)

A photopolymerizable composition composed of the following:

| | | |
|---|---|---|
| Gelatin | grams | 8 |
| Water | cubic centimeters | 90 |
| Cumene hydroperoxide | grams | 1 |
| Lauryl sulfate (25 percent) | cubic centimeters | 2 |
| N,N'-methylene-bisacrylamide | grams | 1 |
| Glycerine | do | 2.4 |
| Ferric ammonium citrate (36 percent) | cubic centimeters | 10 |

was coated on a paper base and exposed to a 375-watt photo floodlight at a distance of 20". The duration of the exposure was 20 seconds. The exposed coating was then dampened for a few seconds with water and pressed face down onto a paper transfer sheet. Upon separating the transfer paper from the photopolymerizable coating, the resulting transfer image was of a high density with a sharp borderline between the unpolymerized and polymerized areas.

*Example III*

A photopolymerizable composition of:

| | | |
|---|---|---|
| Gelatin (7½ percent) | cubic centimeters | 20 |
| N,N'-methylene bisacrylamide | grams | 0.3 |
| Nigrosine | do | 0.3 |
| Phenylethyl alcohol | do | 4 |
| Ferric ammonium citrate (1 molar) | cc | 4.0 |
| Sodium fluoride | grams | 0.3 |

was coated on a paper base and exposed in the identical manner as in Example I. After processing with a 2 percent solution of hydrogen peroxide and pressing firmly against a paper transfer sheet, the resulting transferred image was of good quality with sharp borderlines and free from brown and yellow spots which have a tendency to result from an excessive amount of iron salts in the transferred image.

*Example IV*

A polymerizable coating composition composed of the following:

| | | |
|---|---|---|
| Gelatin (15 percent) | cubic centimeters | 25 |
| Saponine (8 percent solution in water) | do | 3 |
| Nigrosine | grams | 0.35 |
| Benzyl alcohol | do | 1.5 |
| Tricresyl phosphate | do | 1.5 |
| N,N'-methylene bisacrylamide | do | 0.5 |
| Ferric ammonium citrate (1 molar) | cubic centimeters | 20 |
| Polyethylene glycol (molecular weight 1500) | grams | 2 |
| Water | cubic centimeters | 20 |

was coated on a paper base and exposed to a 375-watt photo floodlight at a distance of 20" for 20 seconds. It was noted that this coating had increased stability as well as improved swelling ability when contacted with moisture. The exposed coating was then processed in the identical manner as Example I to yield a transfer image of a high density characterized by processing sharp borderlines.

*Example V*

(OFFSET MASTER PREPARATION)

The following photopolymerization composition:

| | | |
|---|---|---|
| Gelatin | grams | 8 |
| Water | cubic centimeters | 90 |
| Lauryl sulfate (25 percent) | do | 2 |
| Cumene hydroperoxide | grams | 1 |
| N,N'-methylene bisacrylamide | do | 1 |
| Glycerine | do | 2.4 |
| Ferric ammonium citrate (36 percent) | cubic centimeters | 10 |

was coated on a paper base and exposed to a 375-watt photo floodlight at a distance of 20" for 20 seconds. After the exposure, the surface of the coating is dampened with cold water and pressed against a paper transfer sheet using a moderate amount of pressure. Upon pulling apart the two sheets, the transferred photopositive image is allowed to remain on the master. This image is then swabbed with a 0.2 percent aqueous solution of sodium stearate and allowed to dry.

The dried photopolymerized positive image is then placed in a conventional offset printing machine, inked in a conventional manner and then used to produce copies. The machine was run up to 250 copies and these copies and these copies were characterized by possessing good density, a good tone balance and a sharp borderline between the various areas. It is to be understood that more copies could be produced if it was so desired.

*Example VI*

The process of Example I was repeated with the exception that the exposed coating was treated with a 2 percent hydrogen peroxide solution by vaporization instead of dipping the coating into the solution. After the same processing as in Example I, a transferred positive image was obtained of comparable quality.

*Example VII*

The procedure of Example I was repeated with the exception that the exposed photopolymerizable coating was treated with a 1 percent hydrogen peroxide solution from the backside of the exposed sheet during contact with the transfer paper. The resulting image was also of good quality and possessed sharp boundaries, and the light-sensitive layer was free from surface abrasions.

Various modifications of the invention will occur to persons skilled in the art. Thus, it is evident that in lieu of using the compounds of the examples, any of the compounds mentioned above can be employed with similar results. Therefore, it is not intended that the invention be limited in the patent granted except as necessitated by the appended claims.

I claim:

1. In the process of producing a polymeric photographic positive transfer image which comprises exposing to a pattern of actinic radiations, a photographic element comprising a support, carrying a layer comprising a photographic hydrophilic colloid carrier material having dispersed therein at least one ethylenically unsaturated monomer containing the terminal grouping $CH_2=C<$ which is activated by direct attachment to a negative group, and a light-sensitive ferric salt, to form imagewise quantities of activated iron salt in the exposed layer, contacting the exposed layer with water and a per compound containing an O—O— grouping, to effect polymerization of the monomer in proportion to the amount of activated ferric salt; pressing this sheet immediately and without washing against a transfer sheet so as to transfer the unpolymerized portions of the layer to said transfer sheet, the improvement which comprises incorporating a substantially colorless, normally liquid, light heat and moisture-stable water-insoluble, low molecular weight organic crystalloidal compound having a boiling point of at least 175° C. at atmospheric pressure and containing at least one polar group, into said photopolymerizable composition, thereby making it possible to effect the transfer by moderate pressure and without any heat treatment.

2. The process of claim 1 wherein a dye, soluble in said crystalloidal oil, is also incorporated into said photopolymerizable coating.

3. The process of claim 1 wherein said per compound is selected from the group consisting of hydrogen peroxide, cumene hydroperoxide, di-tertiary-butyl peroxide, ammonium persulfate, para-methane hydroperoxide, diisopropyl benzene hydroperoxide and cumene hydroperoxide.

4. The process as defined in claim 1 wherein the monomer is N,N'-methylene-bis-acrylamide, the binder is gelatin, the ferric salt is ferric ammonium citrate and the crystalloidal oil is phenylethyl alcohol.

5. A process according to claim 1 wherein the amount of crystalloidal compound ranges from 5 to 55 percent based on the amount of colloidal carrier material employed.

6. A process of producing a polymeric photographic image which comprises exposing to visible light through a photographic positive a light-sensitive photographic element carrying on a suitable support, a layer comprising a light-sensitive ferric salt of an aliphatic acid and a mixture of acrylamide and N,N'-methylene-bis-acrylamide dispersed in a hydrophilic carrier material, treating the so-exposed layer with an aqueous hydrogen peroxide solution to effect imagewise polymerization in the exposed areas, pressing this sheet immediately and without washing against a transfer sheet so as to transfer the unpolymerized portions of the layer to said transfer sheet, the improvement which comprises incorporating a substantially colorless, normally liquid, light, heat and moisture-stable water-insoluble, low molecular weight organic crystalloidal compound having a boiling point of at least 175° C. at atmospheric pressure and containing at least one polar group, into said photopolymerizable composition, thereby making it possible to effect the transfer by moderate pressure and without any heat treatment.

7. The process of claim 6 wherein the transfer image is further treated with an alkali metal fluoride.

8. The process of claim 6 wherein the transfer image is further treated with sodium stearate.

References Cited by the Examiner

UNITED STATES PATENTS

| | | | |
|---|---|---|---|
| 3,012,885 | 12/1961 | Abbott et al. | 96—35 |
| 3,029,145 | 4/1962 | Dumers et al. | 96—115 |
| 3,042,516 | 7/1962 | Wainer | 96—115 |
| 3,060,023 | 10/1962 | Berg et al. | 96—28 |

NORMAN G. TORCHIN, *Primary Examiner.*

Disclaimer

3,244,519.—*Andre K. Schwerin,* Binghamton, N.Y. PHOTOPOLYMERIZATION IN STRATUM TRANSFER EFFECTED WITH COLORLESS WATER INSOLUBLE COLLOIDAL ORGANIC COMPOUND. Patent dated Apr. 5, 1966. Disclaimer filed Sept. 30, 1982, by the assignee, *Eastman Kodak Co.*

Hereby enters this disclaimer to all claims of said patent.

[*Official Gazette April 5, 1983.*]